Dec. 2, 1958 W. C. DOYLE 2,862,416

LIGHT INTENSITY MEASURING DEVICE INCLUDING SEMICONDUCTOR TRANSLATING CIRCUIT

Filed June 9, 1954

INVENTOR:
WILLIAM C. DOYLE,

BY *Julius J. Zaskalicky*
HIS ATTORNEY.

United States Patent Office 2,862,416

Patented Dec. 2, 1958

2,862,416

LIGHT INTENSITY MEASURING DEVICE INCLUDING SEMICONDUCTOR TRANSLATING CIRCUIT

William Curtis Doyle, Norfolk, Va., assignor to General Electric Company, a corporation of New York Application June 9, 1954, Serial No. 435,458

1 Claim. (Cl. 88—23)

This invention relates to translating circuits, and more particularly, to such circuits utilizing semiconductor devices as the active elements thereof.

Semiconductor amplifying devices, such as transistors, are well-known in the art as devices that exhibit some characteristics similar to vacuum tubes. Semiconductor amplifying devices may be utilized to perform a variety of electrical functions, such as the amplification, generation, and modulation of electrical signals.

Many types of semiconductor amplifying devices are known at the present time, one of the more well-known types being the junction transistor. The present invention is principally directed to this type, and will be particularly described in conjunction therewith; however, the invention is not limited thereto.

In addition to the above-mentioned functions of semiconductor amplifying devices which are similar to those of vacuum tubes, semiconductor devices have a property not possessed by vacuum tubes, namely, under certain conditions, they are photosensitive.

This property enables semiconductor devices to be utilized for controlling or modifying electrical signals in accordance with light variations. Light, when herein mentioned, includes both the visible and invisible portions of the photographic spectrum.

Accordingly, one object of the present invention is to provide an improved signal translating circuit responsive to variations in light intensity.

Another object of the present invention is to provide improved oscillating circuits utilizing semiconductor devices as the active elements therein.

Still another object of the present invention is to provide improved light sensitive circuits utilizing semiconductor devices.

A further object of the present invention is to provide a frequency modulation system wherein the frequency generated by a semiconductor oscillator varies in accordance with the intensity of the light incident on a semiconductor device.

The objects of the present invention may be realized through the provision of a semiconductor amplifying device having a photosensitive area wherein the effective capacitance between the electrodes varies in accordance with the variations of the intensity of light supplied to the photosensitive area. Circuit means connect the device as an oscillator, the effective capacitance of the device being arranged in the circuit in such a manner to cause variations in the frequency of the oscillator in accordance with variations in the magnitude of the effective capacitance, thereby enabling the variations in intensity of the light supplied to the device to cause corresponding variations in the frequency of the oscillator. Means are provided to supply to the photosensitive device light varying in intensity, which variations it is desired to detect. Further, means are provided to detect the variations in frequency of the oscillator, thereby to detect the variations in light intensity.

The features of this invention which are believed to be novel are set forth with particularity in the appended claim. This invention itself, however, both as to its organization and method of operation, together with further objects and advantages thereof, may best be understood by reference to the following specification when read in connection with the accompanying drawings wherein:

Figure 1:
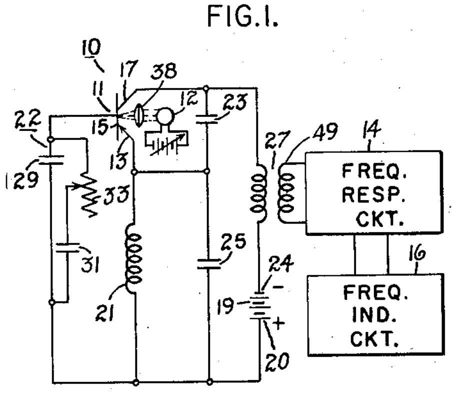
Fig. 1 is a schematic diagram of a semiconductor circuit utilizing the principles of the present invention.

Referring now to Fig. 1, there is shown an illustrative embodiment of the present invention. In this embodiment is shown an oscillator 10 including a photosensitive semiconductor device 11 which is responsive to variations in the intensity of light from a source 12 to cause a change in the frequency of the oscillator. Variations in the frequency of the oscillator are detected by a frequency responsive circuit 14 coupled to the oscillator. Connected to the frequency responsive circuit is a frequency indicating circuit 16 for indicating variations of the frequency of the oscillator.

The oscillator 10 comprises the transistor 11 having an emitter 13, a base 15, and a collector 17. The emitter 13 is connected through an inductance 21, functioning as a choke, to a positive terminal 20 of a source of direct voltage 19. The base electrode 15 is connected to terminal 20 through an oscillator biasing network 22 comprising a capacitance 29 connected in parallel with a series combination of a variable resistance 33 and a capacitance 31. The collector electrode 17 is connected through an inductance 27 to a negative terminal 24 of the source 19. A capacitance 23 is connected between the collector and emitter electrodes. Another capacitance 25 is connected between the emitter 13 and the positive terminal 20 of the source 19.

The oscillator 10 operates in a manner similar to the manner in which similarly-arranged vacuum tube oscillator circuits function. The parallel-resonant circuit comprising the inductance 27 and capacitances 23 and 25 is the principal frequency-determining portion of the oscillator 10. Energization applied to this parallel-resonant circuit by the source 19, causes oscillatory currents to be set up in the resonant circuit. These currents alternately flow between the inductance and capacitance at substantially the natural resonant frequency of the parallel-resonant circuit. A portion of this energy appears across the capacitance 25 and is coupled into the input, or emitter-base circuit, of the transistor 11 where it is amplified. This amplified portion appears in the collector-base circuit of the transistor 11 and is supplied to the parallel-resonant circuit. In view of the fact that the current flow in the inductance 27 is 180° out of phase with the current flow in the capacitance 25 and in view of the fact that the current flow in the emitter-base circuit is 180° out of phase from the current flow in the collector-base circuit, the amplified energy from the transistor 11 sustains the natural oscillation existing in the parallel-resonant circuit.

The oscillations in the parallel-resonant circuit build up to a steady state amplitude value dependent on the bias developed in the emitter-base circuit, the collector current saturation characteristic of the transistor and the loading on the oscillator, similarly as with vacuum tubes. Bias is developed in the emitter-base circuit across the capacitance-resistance biasing network 22 by current flow in this circuit caused by voltage applied to this circuit from the parallel-resonant circuit. The magnitude of this bias can be varied by varying the resistance 33.

The collector-electrode area of the transistor 11 is photosensitive and is responsive to variations in intensity of light applied thereto, thereby to cause a corresponding variation in the capacitance between the collector electrode and the other electrodes of the transistor. A variation in this capacitance causes a variation in the frequency of the oscillator because this capacitance is in shunt with the parallel resonant circuit which is the basic frequency determining portion of the oscillator. Light from the source 12, the intensity of which it is desired to measure, is directed by means of a lens 38 onto the photo-sensitive area of the transistor in order that the intensity thereof may be measured. The output of the oscillator appears across inductance 27 and is coupled by the coil 49 to the frequency responsive circuit 14.

The frequency responsive circuit 14 may comprise any of a variety of such circuits. For oscillators designed to operate at high frequencies, it would be desirable to use a frequency responsive circuit of the kind commonly used in the frequency modulation art for the detection of frequency modulated signals. Any of such detectors, or discriminators as they are known, would be suitable for the present purpose. The frequency indicating circuit used with such a frequency responsive circuit could be any device developing an indication proportional to the output of the frequency responsive circuit.

In the event that the oscillator is arranged to develop oscillations of a frequency falling in the audio band of frequencies any of a variety of frequency responsive circuits well known for such frequencies may be utilized. In one such circuit sine wave oscillations applied to the frequency responsive circuit are converted into square waves. The leading edges of the square waves are then differentiated to form a series of pulses, the number of pulses per second corresponding to the number of cycles per second of the oscillation to be measured. The pulses then are integrated; that is, a summation is taken over a period of time to obtain a voltage proportional to the frequency of oscillation.

While a particular type of transistor has been described in Fig. 1, it will be understood that other types of transistors may be used as well. For example, an NPN type transistor may be used just as well as the PNP type.

Figure 2:
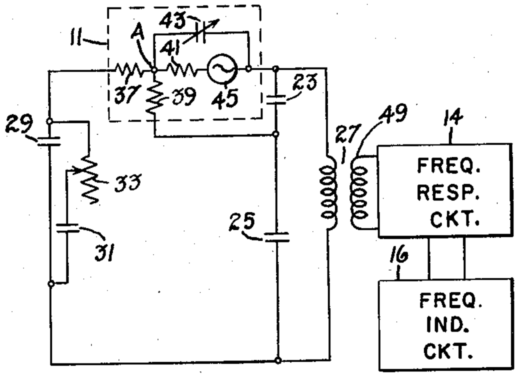
Fig. 2 is an A.-C. equivalent diagram of the circuit illustrated in Fig. 1.

In order to obtain a fuller appreciation of the manner in which the frequency of the oscillator is caused to vary in accordance with a variation in the intensity of incident light, reference is now made to Fig. 2 where there is shown an equivalent circuit diagram of the oscillator depicted in Fig. 1. In this figure elements corresponding to the elements in Fig. 1 have been given the same reference numerals. The transistor 11 has been represented by the equivalent circuit comprising base resistance 37, emitter resistance 39, collector resistance 41 and a signal generator 45. In the equivalent circuit of the transistor, the emitter, collector, and base resistances are connected at the common point A. An equivalent variable capacitance 43 is connected between point A and the output electrode. The other end of the base resistance is connected to the capacitance 29; the other end of the emitter electrode is connected to the capacitance 25; the other end of the collector resistance is connected to the coil 27. The variable capacitance 43 is thus in shunt with the collector resistance 41 and the equivalent signal generator 45. This variable capacitance corresponds to the effective capacitance between collector electrode and the other electrodes of the transistor. The capitance 43 is subject to variation in magnitude in accordance with the variations in light directed on the photosensitive collector electrode area of the transistor 11. Since resistances 37 and 39 are small in magnitude, the capacitance 43 is effectively in shunt with the capacitances 23 and 25 of the parallel resonant circuit, and accordingly, variations in this capacitance cause a variation in the natural resonant frequency of this circuit and hence, the frequency of the oscillator.

Figure 3:
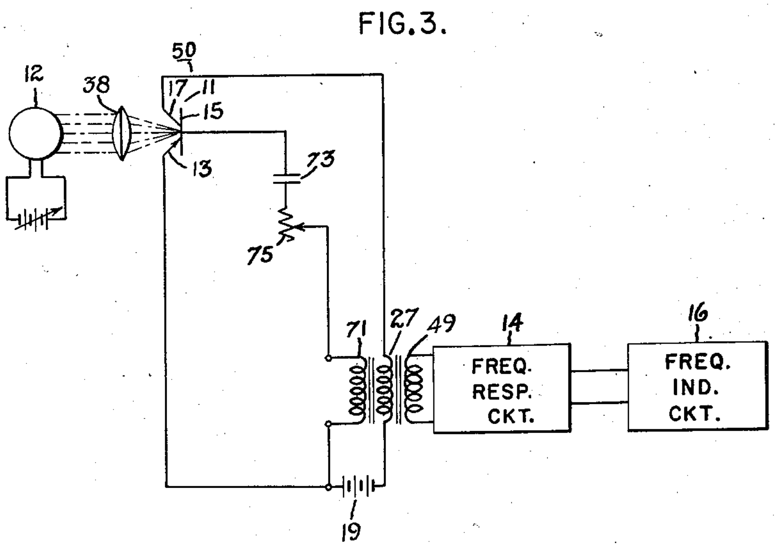
Fig. 3 is a schematic diagram of a modification of the circuit shown in Fig. 1.

Fig. 3 depicts another embodiment of the present invention which is similar to the embodiment of Fig. 1 except that a different type of oscillator circuit is utilized. The elements of Figure 3 which are similar to the elements of Fig. 1 are similarly numbered. The oscillator 50 comprises the photosensitive transistor 11. As in the embodiment depicted in Fig. 1, an output voltage is developed across the inductor 27 and is coupled to the frequency responsive circuit 14. A portion of the voltage developed across the inductor 27 is coupled through a series resonant circuit comprising an inductor 71 and a capacitor 73 to the base-emitter circuit of the transistor 11. The coil 71 is positioned so that the voltage developed across it is 180 degrees out of phase with the voltage developed across inductor 27. Since there is a 180 degree phase shift between the base and collector voltage, the voltage coupled to the base-emitter circuit by the coil 71 is of the proper phase to enable regenerative oscillations.

The frequency of the output voltage is principally determined by the natural resonant frequency of the series resonant circuit comprising the inductor 71 and the capacitor 73. A variable resistor 75 controls the magnitude of the oscillations. As in Fig. 1, light shining on the transistor 11 causes the transistor capacitance to change, thus changing the circuit capacitance, and hence, causing a variation in the frequency of the output voltage in accordance with the intensity of the impinging light.

While the present invention has been described by reference to particular embodiments thereof, it will be understood that numerous modifications may be made by those skilled in the art without actually departing from the true spirit and scope of the invention.

What is claimed to be new and desired to be secured by Letters Patent of the United States is:

A system for measuring the intensity of light comprising an oscillator including a semiconductor device having base, emitter, and collector electrodes, said device having a photosensitive area constructed and arranged so that said device exhibits a variation in collector current in accordance with the variations in the intensity of light supplied to said area, a transformer having a primary and a secondary winding, means connecting said primary winding between said emitter and base electrodes, means connecting said secondary winding in circuit with a direct potential source between said emitter and collector electrodes, so that oscillation is established by the regenerative coupling between said primary and secondary windings, means for supplying to said photosensitive area light varying in intensity which variation it is desired to detect so that variations in intensity of light supplied to said device cause variations in said collector current, and in the frequency of said oscillation, and means for detecting variations in the frequency of said oscillator, thereby detecting said variations in light intensity.

References Cited in the file of this patent

UNITED STATES PATENTS

| | | |
|---|---|---|
| 1,466,701 | De Forest | Sept. 4, 1923 |
| 1,822,061 | Roberts | Sept. 8, 1931 |
| 1,899,026 | Fessenden | Feb. 28, 1933 |
| 2,098,217 | Aubert et al. | Nov. 9, 1937 |
| 2,560,606 | Shive | July 17, 1951 |
| 2,640,901 | Kinman | June 2, 1953 |
| 2,702,838 | Haynes | Feb. 22, 1955 |

OTHER REFERENCES

"Properties of the M–1740 P–N Junction Photocell," by Shive, Institute of Radio Engineers Proceedings, vol. 40, No. 11, November 1952, pages 1410–1413 (page 1412 relied upon).

"A Junction Transistor Tetrode for High-Frequency Use" by Wallace et al., Institute of Radio Engineers Proceedings, vol. 40, No. 11, November 1952, pages 1395–1400.

"Junction Transistor Circuit Applications" by Sulzer, Electronics, August 1953, pages 170–173.

"A Transistorized Audio Oscillator" by Garner, Radio and Television News, September 1953, pages 68–69.